(12) United States Patent
Lassalle-Balier et al.

(10) Patent No.: US 10,866,287 B1
(45) Date of Patent: Dec. 15, 2020

(54) MAGNETIC FIELD SENSOR WITH MAGNETORESISTANCE ELEMENTS ARRANGED IN A BRIDGE AND HAVING A COMMON REFERENCE DIRECTION AND OPPOSITE BIAS DIRECTIONS

(71) Applicant: Allegro MicroSystems, LLC, Manchester, NH (US)

(72) Inventors: Rémy Lassalle-Balier, Bures sur Yvette (FR); Jeffrey Eagen, Manchester, NH (US); Damien Dehu, La-Ville-du-Bois (FR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/507,552

(22) Filed: Jul. 10, 2019

(51) Int. Cl.
*G01R 33/00* (2006.01)
*G01R 33/09* (2006.01)

(52) U.S. Cl.
CPC ....... *G01R 33/0017* (2013.01); *G01R 33/093* (2013.01); *G01R 33/098* (2013.01)

(58) Field of Classification Search
CPC . G01R 33/0017; G01R 33/093; G01R 33/098
See application file for complete search history.

(56) References Cited

U.S. PATENT DOCUMENTS

| | | |
|---|---|---|
| 5,216,560 A | 6/1993 | Brug et al. |
| 5,561,368 A | 10/1996 | Dovek et al. |
| 5,945,825 A * | 8/1999 | Clemens ............... G01R 33/093 324/252 |
| 6,166,539 A | 12/2000 | Dahlberg et al. |
| 6,501,678 B1 | 12/2002 | Lenssen et al. |
| 7,064,937 B2 | 6/2006 | Wan et al. |
| 7,259,545 B2 | 8/2007 | Stauth et al. |
| 7,838,133 B2 | 11/2010 | Zhang et al. |
| 8,129,988 B2 * | 3/2012 | Fermon ................. G01R 33/09 324/252 |
| 8,269,491 B2 | 9/2012 | Cummings et al. |
| 9,046,562 B2 | 6/2015 | Cummings et al. |
| 9,465,056 B2 | 10/2016 | Han et al. |
| 9,664,494 B2 | 5/2017 | Fernandez et al. |
| 9,921,275 B2 * | 3/2018 | Komasaki ............. G01R 33/09 |
| 10,060,880 B2 | 8/2018 | Chen et al. |
| 2008/0258721 A1 | 10/2008 | Guo et al. |
| 2009/0237075 A1 | 9/2009 | Koss |
| 2010/0007344 A1 | 1/2010 | Guo et al. |
| 2010/0277971 A1 | 11/2010 | Slaughter et al. |
| 2011/0062537 A1 | 3/2011 | Oh et al. |
| 2015/0022196 A1 | 1/2015 | Hebiguchi et al. |
| 2015/0177286 A1 | 6/2015 | Fuji et al. |

(Continued)

OTHER PUBLICATIONS

Notice of Allowance dated Dec. 23, 2019 for U.S. Appl. No. 15/895,418; 13 pages.

(Continued)

*Primary Examiner* — Reena Aurora
(74) *Attorney, Agent, or Firm* — Daly, Crowley, Mofford & Durkee, LLP

(57) ABSTRACT

A magnetic field sensor can include four magnetoresistance elements arranged in a bridge, wherein two of the magnetoresistance elements have a response to an external or stray magnetic field that is opposite to a response of the other two magnetoresistance elements.

19 Claims, 12 Drawing Sheets

(56) References Cited

U.S. PATENT DOCUMENTS

| | | |
|---|---|---|
| 2015/0333254 A1 | 11/2015 | Liu et al. |
| 2016/0359103 A1 | 12/2016 | Fermon et al. |
| 2017/0314969 A1 | 11/2017 | Ausserlechner et al. |
| 2019/0219616 A1 | 7/2019 | Cadugan et al. |
| 2019/0219643 A1 | 7/2019 | Cadugan et al. |

OTHER PUBLICATIONS

U.S. Appl. No. 16/157,317, filed Oct. 11, 2018, Lassalle-Balier et al..
U.S. Appl. No. 16/157,313, filed Oct. 11, 2018, Lassalle-Balier et al.
U.S. Appl. No. 16/578,767, filed Sep. 23, 2019, Cadugan et al.
Allegro MicroSystems LLC, datasheet ACS70331 "High Sensitivity, 1 MHz GMR-Based Current Sensor IC in Space-Saving Low Resistance QFN Package;" Dec. 1, 2017; 22 Pages.
Notice of Allowance dated Aug. 22, 2019 for U.S. Appl. No. 15/869,620; 11 pages.
Notice of Allowance dated Aug. 8, 2019 for U.S. Appl. No. 15/895,418; 10 pages.
Amendment and Request for Continued Examination (RCE) dated Sep. 30, 2019 for U.S. Appl. No. 15/895,418; 27 pages.

\* cited by examiner

MAGNETIC FIELD SENSOR WITH MAGNETORESISTANCE ELEMENTS ARRANGED IN A BRIDGE AND HAVING A COMMON REFERENCE DIRECTION AND OPPOSITE BIAS DIRECTIONS

FIELD

This disclosure relates to magnetic field sensors and, more particularly, to magnetic field sensors with magnetoresistance elements with varying sensitivity in response to a varying magnetic field.

BACKGROUND

Magnetoresistance elements act as variable resistors with a resistance controlled by an external magnetic field. A single pinned magnetoresistance element can have a free layer and a reference layer structure with a reference magnetic field having a reference magnetic direction. The reference layer structure can have a reference pinning layer and a reference pinned layer structure. A double pinned magnetoresistance element can have the above elements plus a bias layer structure with bias magnetic field having a bias magnetic direction.

Magnetoresistance elements can include a free layer. In operation, a magnetic direction of the free layer can move or align with a magnetic direction of an external magnetic field. When the direction of the free layer aligns with the magnetic direction of the reference pinned layer structure, the electrical resistance of the magnetoresistance element is minimized. As the free layer moves and becomes misaligned with the reference pinned layer structure, the resistance of the magnetoresistance element increases. Note that the effect may be the opposite in different types of magnetoresistance elements. Suffice it to say that, as the external field alters the magnetic direction of the free layer, the resistance of the magnetoresistance element changes.

The sensitivity of a magnetoresistance element to a magnetic field can change. For example, a stray field (i.e., an external magnetic field) in the direction of the bias magnetic field (generated by a bias layer structure or generated by a biasing external magnetic field) can change the magnetoresistance element's sensitivity to the external magnetic field to be detected by the magnetoresistance element. Other factors, such as design, position, temperature, etc. can also change the double magnetoresistance element's sensitivity.

There are various types of magnetoresistance elements. For example, giant magnetoresistance (GMR) elements and tunneling magnetoresistance (TMR) elements are known, both in signal pinned and double pinned configurations. GMR elements used for linear operation within a linear range can have a yoke shape. In contrast, TMR elements often have a pillar (cylindrical) shape and are often formed as multiple such pillars coupled in series to avoid excessive voltage on any one pillar.

Magnetoresistance can be coupled in a bridge arrangement. In a four element bridge arrangement, it would be advantageous to have two of the magnetoresistance element have an opposite response to magnetic fields than the other two magnetoresistance elements, so that the bridge arrangement can provide a fully differential signal. However, providing magnetoresistance elements with opposite responses to magnetic fields can be difficult, and may require a repining of two of the magnetoresistance elements.

SUMMARY

The present invention provides four magnetoresistance elements that can be arranged in a bridge, wherein two of the magnetoresistance elements have an opposite response to magnetic fields than the other two magnetoresistance elements, achieved without repining any of the magnetoresistance elements.

In accordance with an example useful for understanding an aspect of the present invention, a magnetic field sensor can include first, second, third, and fourth magnetoresistance elements coupled to form a bridge circuit, wherein the first and second magnetoresistance elements are coupled in a first series arrangement at a first junction node and the third and fourth magnetoresistance elements are coupled in a second series arrangement at a second junction node, wherein a differential signal is generated between the first and second junction nodes, wherein the first, second, third, and fourth magnetoresistance elements comprise respective first, second, third and fourth reference layer structures having a respective first, second, third, and fourth reference directions, each in the same direction, wherein the first and fourth magnetoresistance elements experience respective first and fourth bias magnetic fields, each having a first direction orthogonal to the reference direction, wherein the second and third magnetoresistance elements experience respective second and third bias magnetic fields each having a second direction opposite to the first direction, resulting in the first and fourth magnetoresistance elements having a first direction of maximum sensitivity and the second and third magnetoresistance elements having a second direction of maximum sensitivity opposite to the first direction of maximum sensitivity, wherein each one of the first, second, third, and fourth magnetoresistance elements is arranged to experience substantially the same magnitude and direction of an external magnetic field, and wherein the bridge circuit is positioned so that, in the presence of the external magnetic field, respective sensitivities of the first, second, third, and fourth magnetoresistance elements change in response to the external magnetic field.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
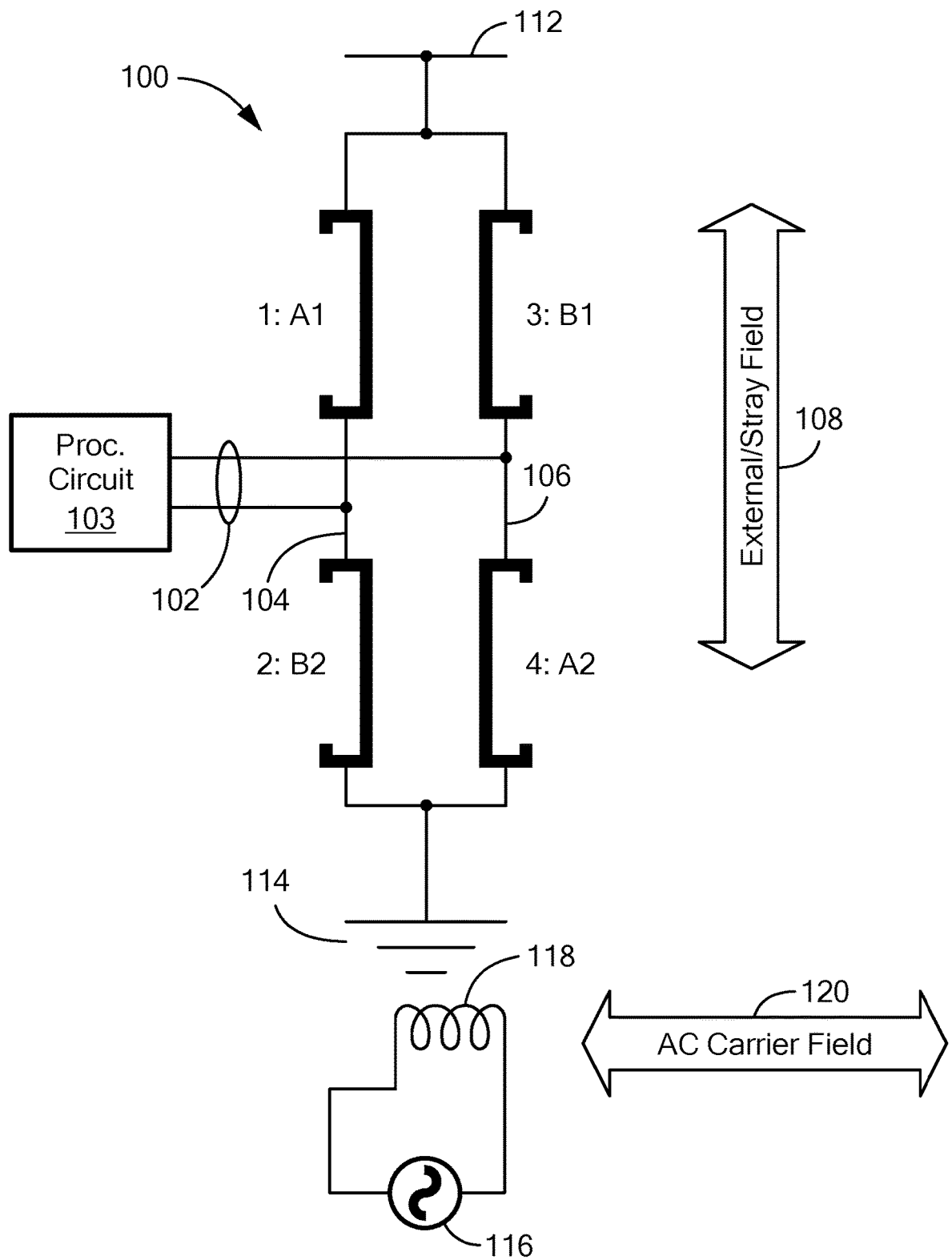
FIG. 1 is a block diagram of a portion of a magnetic field sensor having four double pinned GMR elements, a processor, and a carrier field circuit for generating an AC carrier magnetic field.

FIG. 1 is a circuit diagram of a bridge circuit 100 having a first GMR element A1, a second GMR element B2, a third GMR element B1, and a fourth GMR element A2. Bridge circuit 100 may be configured to detect external or stray magnetic field 108, which may be a DC or AC magnetic field. In embodiments, the GMR elements A1, A2, B1, B2 may be replace by another type of magnetoresistance elements, e.g., TMR or AMR elements.

The first and second magnetoresistance elements A1, B2 can be coupled in a first series arrangement at a first junction node 104, and the third and fourth magnetoresistance elements B1, A2 can be coupled in a second series arrangement at a second junction node 106. A differential signal 102 is generated between the first and second junction nodes 104, 106. The first, second, third, and fourth magnetoresistance elements A1, B2, B1, A2, respectively, comprise respective first, second, third and fourth reference layer structures having respective first, second, third, and fourth reference directions, each in the same direction. The first and fourth magnetoresistance elements A1, A2, respectively, experience respective first and fourth bias magnetic fields, each having a first direction orthogonal to the reference direction. The second and third magnetoresistance elements B2, B1 experience respective second and third bias magnetic fields each having a second direction opposite to the first direction, resulting in the first and fourth magnetoresistance elements having a first direction of maximum sensitivity and the second and third magnetoresistance elements having a second direction of maximum sensitivity opposite to the first direction of maximum sensitivity.

Opposite bias directions of the GMR elements described in figures below can result in the voltages at nodes 104 and 106 moving in opposite directions in response to external or stray magnetic 108 and carrier field 120. Thus, bridge circuit 100 may produce a differential output signal 102, which is the voltage difference between nodes 104 and 106.

The two different bias directions can result from techniques described in conjunction with FIG. 4 below A carrier field circuit comprised of an oscillator 116 and a coil 118, or the like, can generate an AC carrier magnetic field 120 experienced by the GMR elements A1, A2, B1, B2 so that the differential signal 104, 106 can be an AC signal modulated in amplitude by the external or stray magnetic field 108.

A processor circuit 103 can process, e.g., demodulate, the modulated differential signal 104, 106 to determine the external or stray magnetic field.

Elements of FIG. 1 can be parts of a magnetic field sensor described below in conjunction with FIG. 3.

Figure 2:
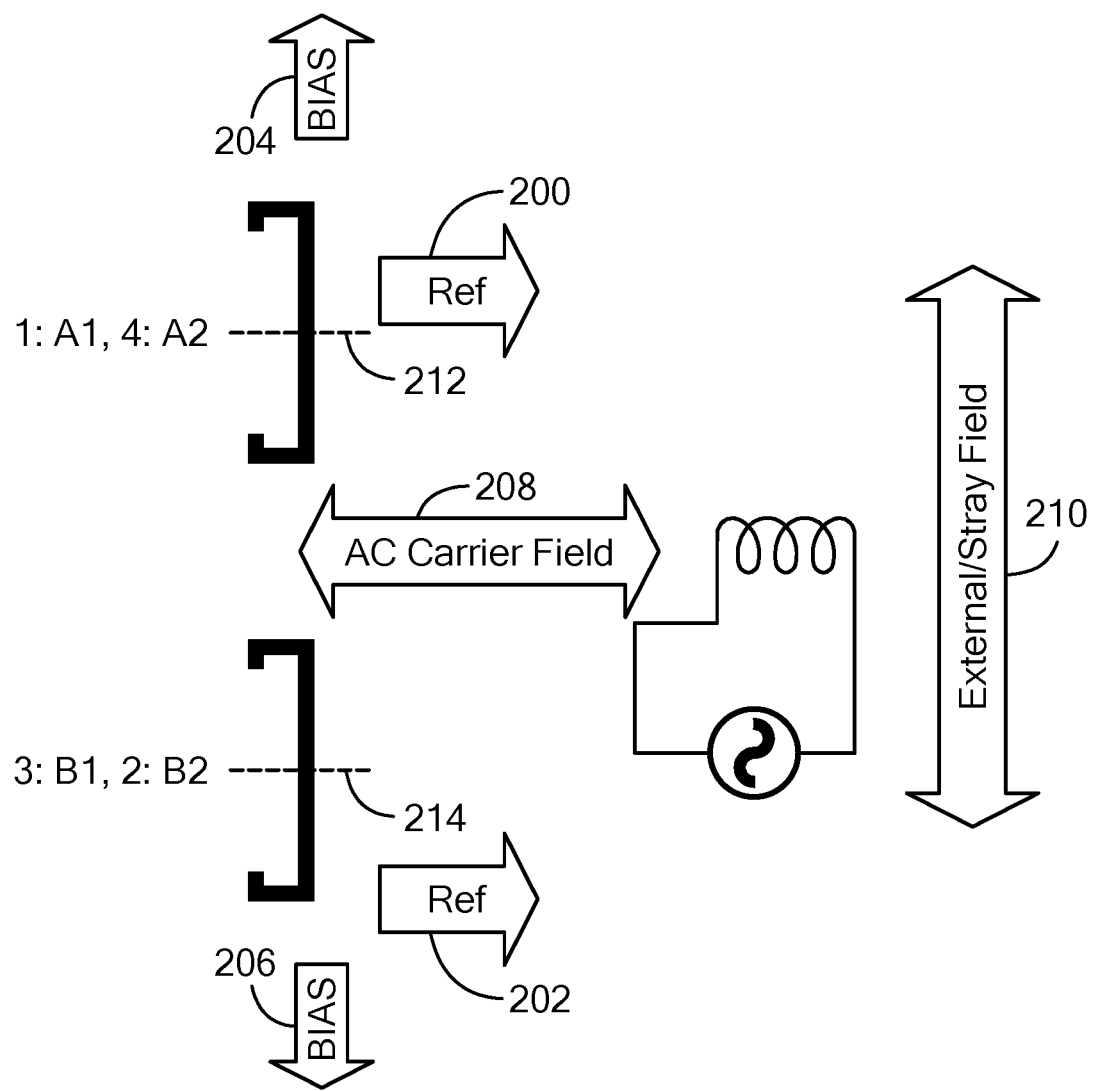
FIG. 2 is a block diagram of a portion of a magnetic field sensor having four double pinned GMR elements showing bias and reference directions of the four double pinned GMR elements, maximum response axes of the four double pinned GMR elements, a direction of an AC carrier magnetic field experienced by the four double pinned GMR elements, and a direction of a stray or external magnetic field sensed by the four double pinned GMR elements.

Referring now to FIG. 2 bias and reference directions of GMR elements A1, A2, B1, B2 of FIG. 1 are explicitly shown. Nomenclature, for example 1: A1, 4: A2 is a way to indicate that GMR element A1 is referred to as a first GMR element and GMR element A2 is referred to as a fourth GMR element for reasons that should be apparent from the arrangement of FIG. 1.

As indicated, GMR elements A1 and A2 have a reference direction 200 in the same direction as reference direction 202 of GMR elements B1, B2. However, GMR elements A1, A2 have a bias direction 204, in the opposite direction as bias direction 206 of GMR elements B1, B2. Thus, GMR elements A1, A2 respond in a different direction than the GMR elements B1, B2 to the external or stray magnetic field 210.

Maximum response axes 212, 214 of the GMR elements A1, A2, B1, B2 are parallel to the reference directions 200, 202. An AC carrier field 208 can be applied to the GMR elements A1, A2, B1, B2 in directions parallel to the reference directions 200, 202, to which the GMR elements A1, A2, B1, B2 are directly responsive. Thus, GMR elements A1, A2, B1, B2 are directly responsive to, i.e., change resistance in response to, the AC carrier magnetic field 208, with sensitivities related to the bias magnetic fields 204, 206.

In contrast, the GMR elements A1, A2, B1, B2 are not directly responsive to magnetic fields in a direction perpendicular to the reference directions 200, 202, i.e., in directions parallel to the bias magnetic fields 204, 206. However, as described below, the bias magnetic fields 204, 206 within bias layer structures of the GMR elements A1, A2, B1, B2 can be altered by the external or stray magnetic field 210, thereby affecting sensitivities of the GMR elements A1, A2, B1, B2.

Figure 3:
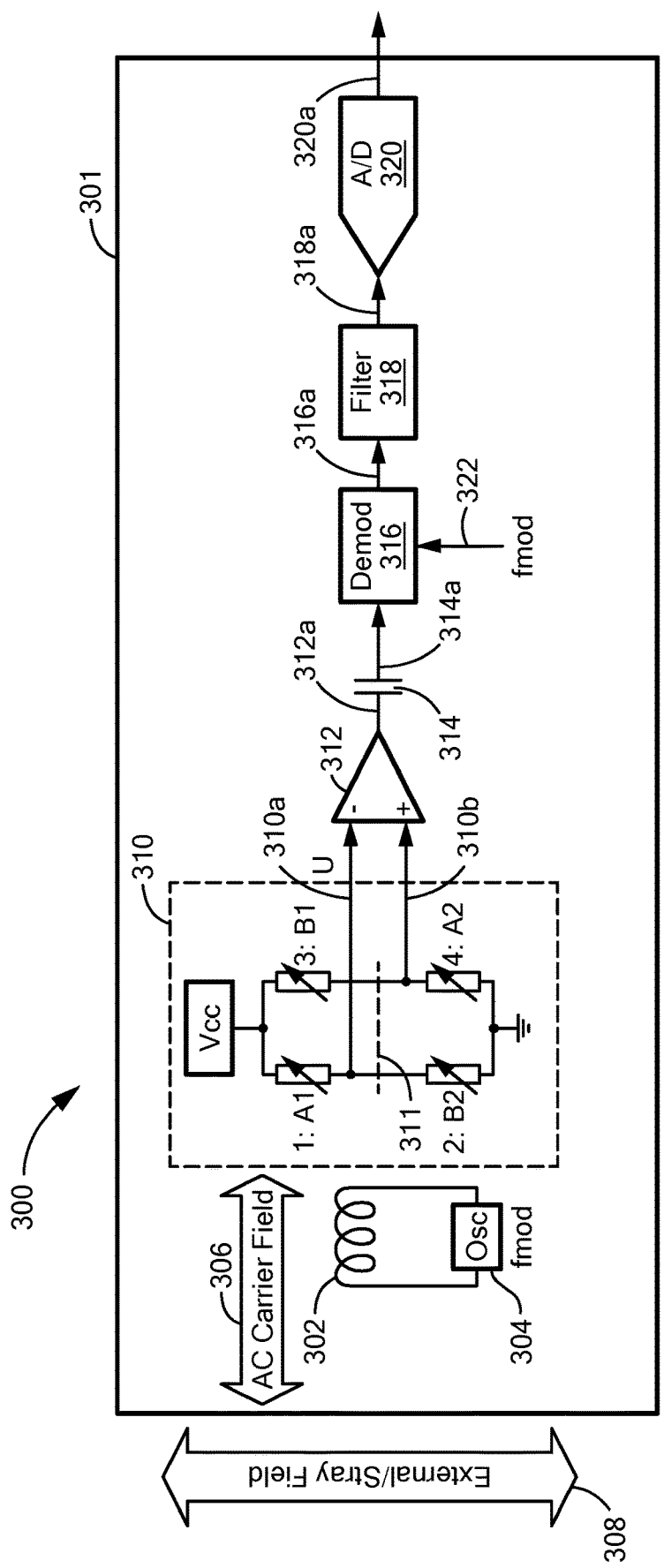
FIG. 3 is a block diagram showing an illustrative magnetic field sensor having four double pinned GMR elements coupled in a bridge for generating a bridge signal, a carrier field circuit to generate an AC carrier magnetic field experienced by the four double pinned GMR elements, and a processing circuit having a demodulation circuit to process the bridge signal.

Referring now to FIG. 3, a magnetic field sensor 30 can include a bridge circuit 310 having the four GMR elements A1, A2, B1, B2 of FIGS. 1 and 2. The bridge circuit 310 is operable to generate a differential bridge signal 310a, 310b. Each of the four GMR elements A1, A2, B1, B2 can have a respective maximum response axis substantially parallel to an axis 311 and in the same direction. As described below in conjunction with FIG. 4, this is also the magnetic direction of reference layers within the four GMR elements A1, A2, B1, B2.

The magnetic field sensor 300 can include an oscillator 304 for generating an oscillator signals having a frequency fmod. The oscillator signal can be a square wave, a sine wave, a triangle wave, or any repetitive signal. The oscillator 304 can be coupled to a coil or the like to generate an AC carrier magnetic field 306 experienced by each one of the four GMR elements. The AC carrier magnetic field 306 is in a direction parallel to, or has a direction component parallel to, the maximum response axes of the four GMR elements 310. Therefore, the four GMR elements 310 are directly responsive to the AC carrier magnetic field. As a result, the differential bridge signal 310a, 310b can be a square wave, a sine wave, a triangle signal. A sine wave is assumed in examples herein.

An amplifier 312 can receive the bridge signal 310a, 310b and can generate an amplified signal 312a.

A capacitor 314 can receive the amplified signal 312a and can generate an AC coupled signal 314a.

A demodulation circuit 316, also referred to herein as an amplitude detector circuit 316, can receive the AC coupled signal 314a and can generate a demodulated signal 316a, also referred to herein as an amplitude detected signal.

A filter 318, for example, a low pass filter, can receive the demodulated signal 316a and can generate a filtered signal 318a.

An analog to digital converter 320 (ADC) can receive the filtered signal 318a and can generate a digital signal 320a representative of an amplitude of an external magnetic field 308 experienced by the four GMR Elements 310.

The external or stray magnetic field 308 is in a direction perpendicular to the maximum response axes of the four GMR elements A1, A2, B1, B2, and thus, the four GMR elements are not directly responsive to the external or stray magnetic field 308. However, as discussed below in conjunction with FIG. 4, the external or stray magnetic field 308 is parallel to a direction of magnetic fields within bias layer structures within each one of the four GMR elements 310, which results in changes of sensitivities of the four GMR elements 310 in response to the external or stray magnetic field 308.

In operation, an amplitude of the differential bridge signal 310a, 310b can be influenced by the external or stray magnetic field 308, causing an amplitude modulation of the differential bridge signal 310a, 310b. The amplitude modulation can be detected by the demodulation circuit 316 and filter 318.

In other embodiments, the demodulation circuit 316 can be replaced with a rectifier, e.g., a full wave rectifier, also referred to as an amplitude detector circuit. In other embodiments, the capacitor 314 is not used. In other embodiments, the ADC 320 is not used.

Figure 4:
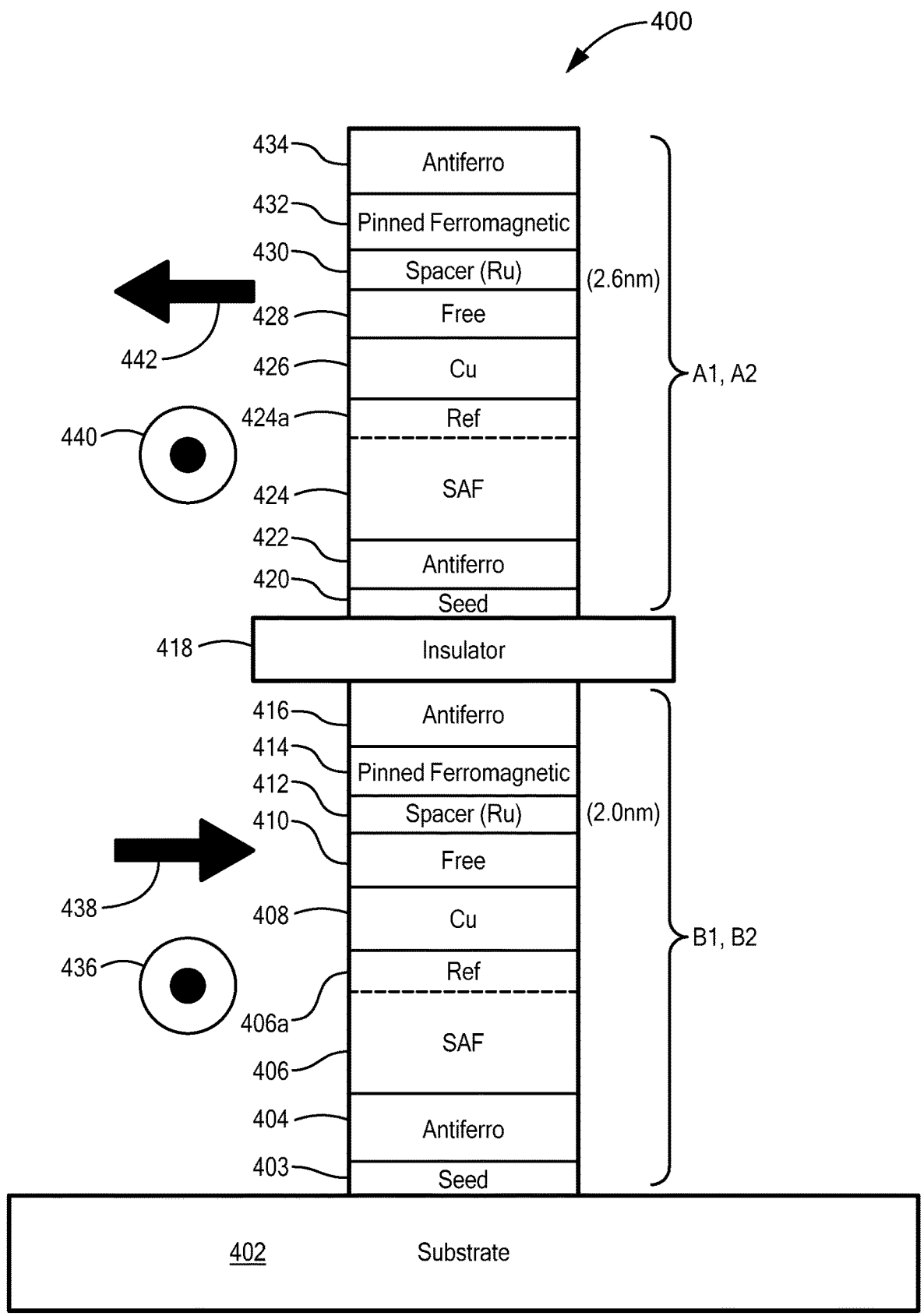
FIG. 4 is a block diagram showing a particular arrangement of two double pinned GMR magnetoresistance elements in a single stack of layers, showing bias and reference directions, wherein the bridge of FIG. 3 and the magnetic field sensor portion of FIGS. 1 and 2 can be formed from two of such arrangements of two double pinned GMR elements.

Referring now to FIG. 4 a dual stack 400 of GMR elements A1, B1 (or A2, B2 in a second stack of layers) can be disposed over a substrate 402. GMR elements A1, A2 will be shown to have the same bias direction, opposite from the bias direction of GMR element B1 and B2.

As shown, GMR element A1 may be disposed over GMR element B1. An electrically insulating layer 418 may separate GMR elements A1, B1 (and A2, B2). In an embodiment, insulating layer 418 may be formed from SiO2, SiN, MgO, AlO2 material and may have a thickness of 4 nm or greater. The insulating layer 418 results in the two GMR elements A1, B2 being essentially isolated from each other.

GMR element A1 may include a seed layer 403 disposed over a substrate 402 and an antiferromagnetic layer 404 disposed over the seed layer. A synthetic antiferromagnet (SAF) structure 406 can be disposed over the antiferromagnetic layer 404. Not shown, the SAF structure 406 can include two ferromagnetic layers, e.g., CoFe layers, separated by a spacer layer, e.g., Ru. A thickness and a material of the spacer layer can be selected to result in antiferromagnetic coupling between the two ferromagnetic layers of the synthetic antiferromagnet (SAF) structure 406. Reference layer 406a can be an upper one of the two ferromagnetic layers and can be referred to as a reference layer that tends to set a reference direction of the GMR element B1, here shown as an arrow 436 coming out of the page. Antiferromagnetic layer 404 and synthetic antiferromagnet (SAF) structure 406, including the reference layer 406a, can be referred to as a reference layer structure.

A conductive layer 408, e.g., a Cu layer, can be disposed over the SAF structure 406. One or more free layers 410 can be disposed over the conductive layer 408.

A spacer layer 412 can be disposed over the one or more free layers 410.

A pinned ferromagnetic layer 414 can be disposed over the spacer layer 412.

The spacer layer 412 can be comprised of a material and have a thickness selected to result in a selected one of a ferromagnetic or an antiferromagnetic coupling between the one or more free layers 410 and the synthetic antiferromagnet (SAF) structure 414. Thus, the spacer layer 412 tends to set a bias direction of the GMR element B1 (or B2), here shown as an arrow 438 pointing to the right. In some embodiments, the spacer layer 412 is comprised of Ru and has a thickness of about 2.0 nm.

Another antiferromagnetic layer 416 can be disposed over the synthetic antiferromagnet (SAF) structure 414. Antiferromagnetic layer 416, synthetic antiferromagnet (SAF) structure 414, and spacer layer 412 can be referred to as a bias layer structure. The bias layer structure biases free layer 410 so that, in the absence of an external magnetic field, the free layer 410 has a magnetic direction (i.e. polarity) as shown by the arrow 438.

The antiferromagnetic layers 404, 416 are also referred to as pinning layers. The SAF layer structures 416, 406 are also referred to as pinned layers.

GMR element A1 (or A2) may include layers 420-434 the same as or similar to the layers 403-416 of the GMR element B1, except that the spacer layer 430 can be different than the spacer layer 412. Spacer layer 430 can be comprised of a material and can have a thickness selected to result in ferromagnetic coupling when compared to the antiferromagnetic coupling across the spacer layer 412. In some embodiments, the spacer layer 430 is comprised of Ru and has a thickness of about 2.6 nm. Thus, the bias direction of the GMR element A1 represented by an arrow 442 can be opposite to the bias direction of the GMR element B1 represented by the arrow 438, while the reference directions represented by arrows 440, 436 can be the same. Since common mode field adds up with the biases, the effective bias of two of the GMRs gets higher (i.e., lower sensitivity) while the two others have lower bias (i.e., higher sensitivity) and it is the difference in sensitivity that generates the output signal.

GMR elements A1 and B1 may be formed by sequentially depositing the various layers onto substrate 402. After the stack of layers is formed, in a first annealing step, all layers can be annealed with a first annealing magnetic field in a direction shown by arrows 436, 440. All reference layers thus have this direction. Then, in a second annealing step, the stack of layers may be exposed to a second annealing magnetic field (with a different magnitude, time, and direction) at ninety degrees with respect to the first annealing magnetic field in a direction represented by the arrow 442. The different annealing magnetic field can result in a different magnetic direction in bias layer structures 414, 416 and 434, 432, but without changing magnetic directions of the reference layer structures 404, 406 or 422, 424. Different thicknesses of spacer layers 410, 430 can result in the opposite bias directions indicated by the arrows 438, 442.

GMR elements A2 and B2 in FIG. 1 may be formed similarly to GMR elements A1 and B1. All four GMR element can be coupled in a bridge arrangement described above in conjunction with FIGS. 1 and 3.

Figure 5:
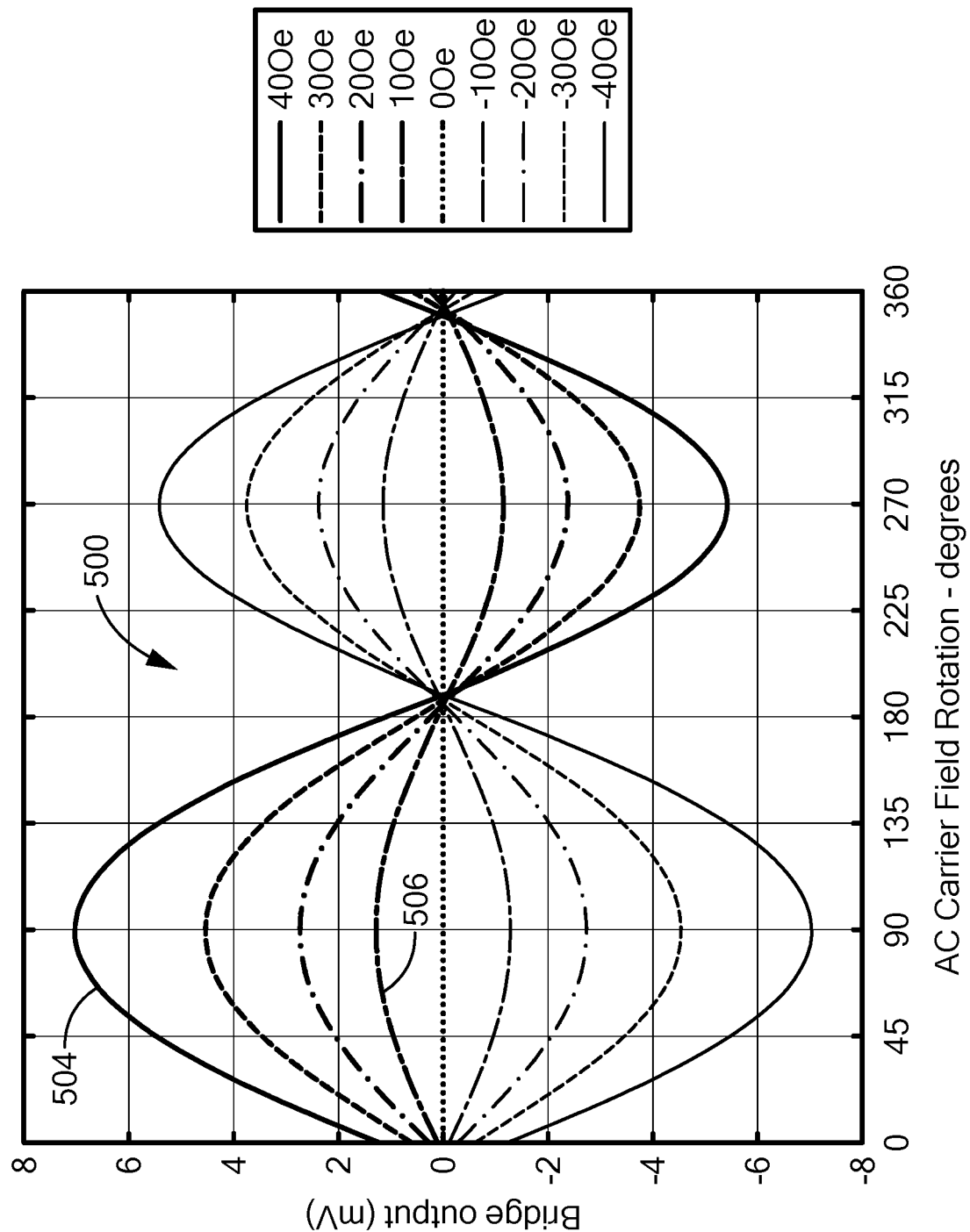
FIG. 5 is a graph of a signal generated by the bridge arrangements of FIGS. 1, 2 and 3 in response to an AC carrier magnetic field parallel to a reference direction of the four GMR elements of FIGS. 1, 2 and 3.

Referring now to FIG. 5, graph 500 is indicative of a signal, e.g., the differential bridge signal 310a, 310b of FIG. 3, generated by the bridge circuit 310 of FIG. 3 when exposed to an AC carrier magnetic field, e.g., AC carrier magnetic field 306 of FIG. 3. The differential signal 310a, 310b can include a carrier signal responsive to the AC carrier magnetic field. In this graph, an internal bias magnetic field within the four GMR elements 310 is about 80 Oersteds.

The horizontal axis represents the angle of the AC carrier magnetic field 120 in degrees and the vertical axis represents voltage in millivolts. Each waveform represents the differential bridge signal 310a, 310b of FIG. 3 in response to a different amplitude of the external or stray magnetic field 308 of FIG. 1, which is here assumed to be a DC magnetic field. For example, waveform 504 represents the differential bridge signal 301, 310b when bridge circuit 310 is exposed to an external or stray magnetic field 308 with relatively high magnetic field strength and waveform 506 represents the differential bridge signal 310a, 310b when bridge circuit 310 is exposed to an external or stray magnetic field 308 with relatively low magnetic field strength.

The lobes of the curves have different amplitudes when the DC external or stray magnetic field 308 is applied, since the bias magnetic fields may not be perfectly oriented at ninety degrees relative to the reference magnetic fields.

As shown, the differential bridge signals follow a generally sinusoidal pattern in response to the AC carrier magnetic field 306. The amplitude of the differential bridge signal 310a, 310b is proportional to the strength of the external or stray magnetic field 308. Thus, an AC external or stray magnetic field will result in an amplitude modulation of the carrier signal, i.e., an amplified modulated (AM) signal.

Figure 6:
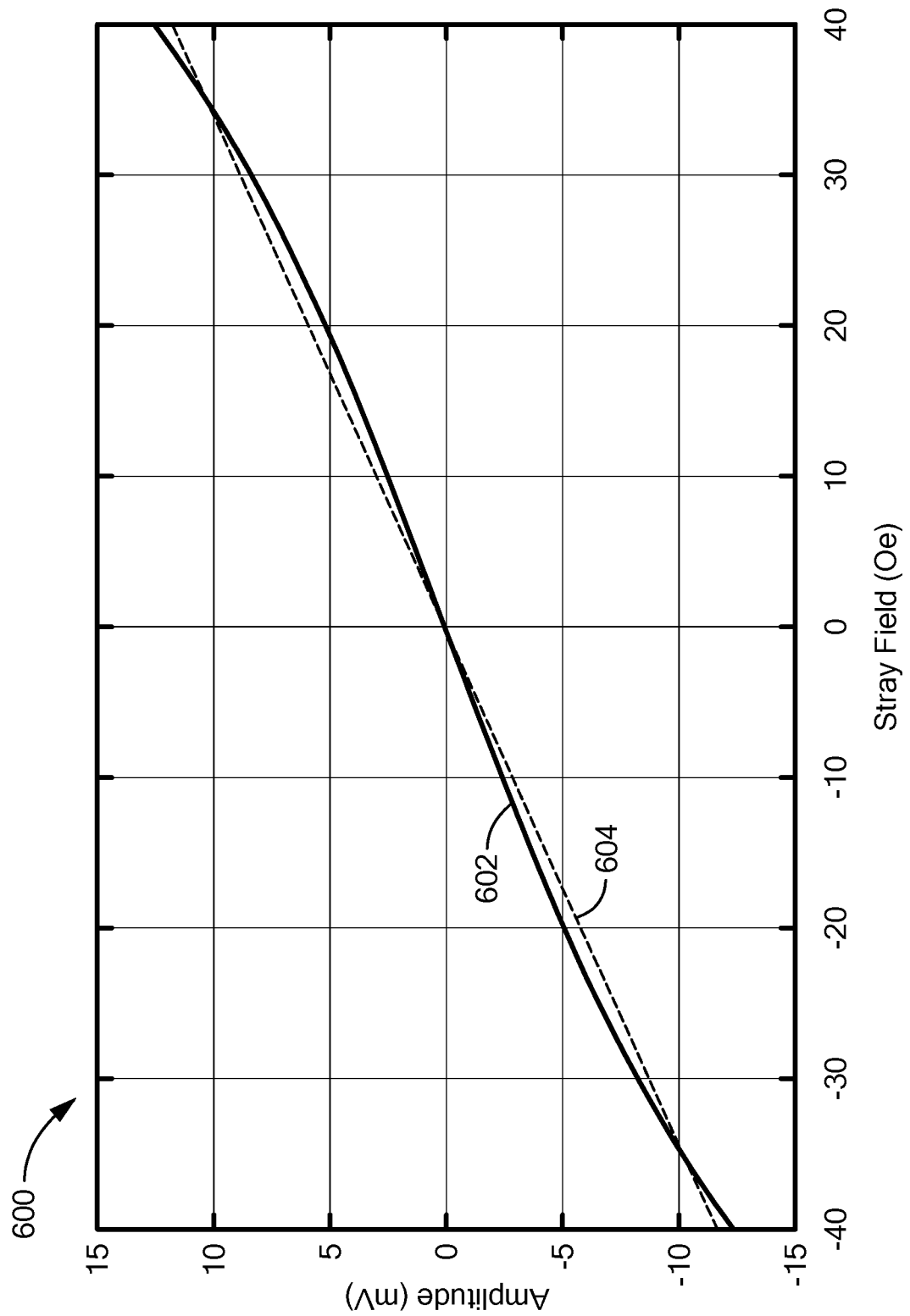
FIG. 6 is a graph of a demodulated signal generated by the demodulation circuit of FIG. 3, i.e., amplitude of the signal of FIG. 5 in response to different DC external magnetic fields parallel to a bias direction of the GMR elements of FIGS. 1, 2, and 3, generated by a magnetic field sensor having four double pinned GMR elements arranged in the bridge of FIG. 3.

Referring now to FIG. 6, a graph 600 shows a response of the magnetic field sensor 300 of FIG. 3, and, in particular, a response of the demodulation circuit 316 and filter 318, in response to the external or stray magnetic field 308 in a bias direction when in the presence of the AC carrier magnetic field 306 in the reference direction. The horizontal axis represents external stray field strength in Oersteds and the vertical axis represents voltage in millivolts. Curve 602 shows the simulated response and curve 604 shows a linear response. A difference between the curves 602, 604 is indicative of a linearity error.

Figure 7:
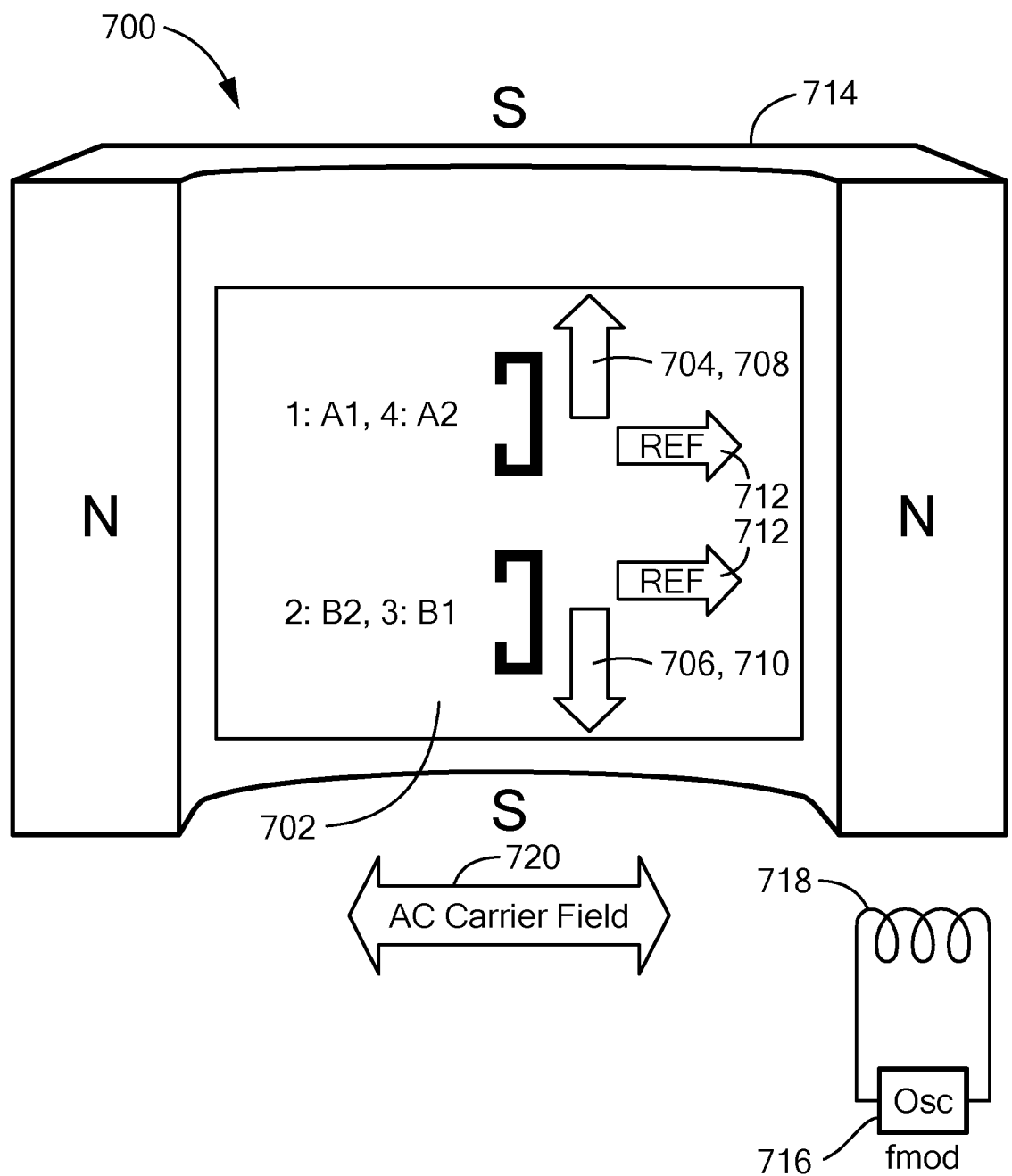
FIG. 7 is a block diagram showing a portion of a magnetic field sensor having a magnet and four single pinned GMR elements with a common reference direction, showing a circuit for generating a AC carrier magnetic field experience by the four single pinned GMR elements, and wherein opposite bias directions are generated by the magnet and not by bias layers within the single GMR elements.

Referring to FIG. 7, a portion 700 of a magnetic field sensor includes a bridge circuit comprising four single pinned GMR elements A1, A2, B1, B2 which do not include internal bias layers described above in conjunction with FIG. 3. An example of a single pinned GMR element is shown below in conjunction with FIG. 8.

The GMR elements may be electrically connected to form a bridge circuit, like bridge circuit 310 of FIG. 3. The coupling is also described in conjunction with FIG. 10.

The GMR elements A1, A2, B1, B2 may be supported by substrate 702, which may be the same as or similar to substrate 301 of FIG. 3. Substrate 702 may be a semiconductor substrate such as a silicon substrate, a semiconducting ceramic substrate, or the like. Substrate 702 may also support other integrated circuits such as circuit elements shown in FIG. 3.

A magnet 714 may be placed a shown relative to the GMR elements A1, A2, B1, B2 to result in bias magnetic fields at the GMR elements A1, A2, B1, B2 indicated by the arrows 704-710. The single pinned GMR elements A1, A2, B1, B2 do not have internal bias layer structures described above in conjunction with FIG. 3. Instead, biasing is provided by magnetic fields generated by the magnet 714.

As described above, bias magnetic fields and associated directions at each one of the GMR elements A1, A2, B1, B2 are indicated by arrows 704-710. All of the GMR elements A1, A2, B1, B2 may have respective reference layer structures with internal reference magnetic fields in the same direction shown by an arrow 712. Bias directions 704-710 generated by the magnetic 714 may be substantially perpendicular to reference direction 712.

In some embodiments, a magnetic source such as coil 718 may produce an AC carrier magnetic field with a direction substantially parallel to reference direction 712. The AC carrier magnetic field 720 may be an AC field, with an AC shape, for example, a sinusoid, a ramp, a sawtooth, or any other wave shape.

In contrast, an external or stray magnetic field parallel to the bias directions 704, 706 may affect GMR elements A1, A2, B1, B2 by changing or modulating the sensitivity of the GMR elements. For example, if the external or stray magnetic field is in a direction of the bias magnetic fields represented by the arrow 704, 708, the sensitivity of GMR element A1 and A2 may be increased and the sensitivity of the GMR elements B1 and B2 may be decreased.

The four single pinned GMR elements A1, A2, B1, B2 can be used in place of the four GMR element A1, A2, B1, B2 of FIG. 3.

Figure 8:
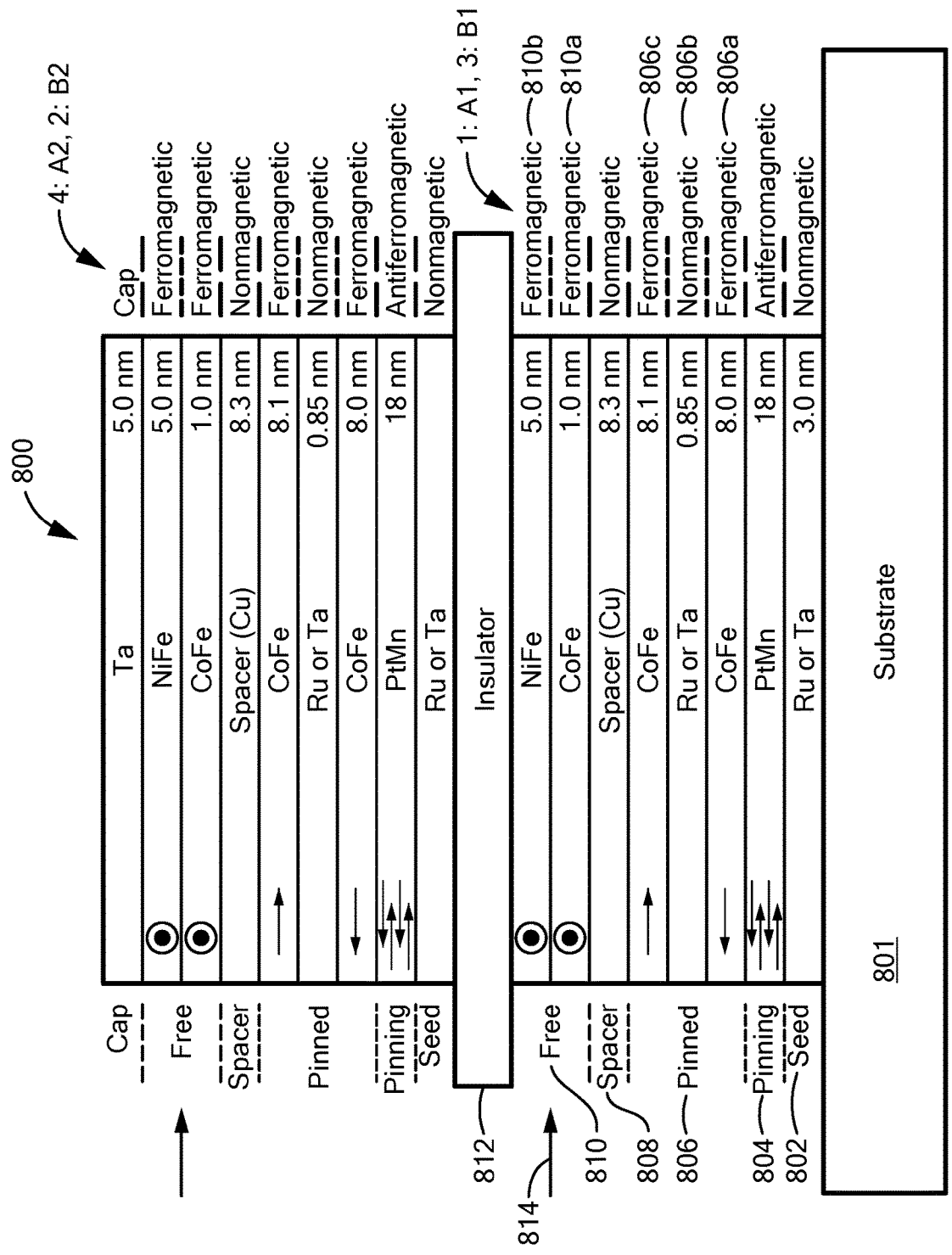
FIG. 8 is a block diagram showing a particular arrangement of two single pinned GMR magnetoresistance elements in a single stack of layers, wherein the bridge of FIG. 3 can be formed from two of such arrangements of two single double pinned GMR elements.

Referring now to FIG. 8, a dual stack 800 of GMR elements A1, A2 (or B1, B2 in a second stack of layers) can be disposed over a substrate 80. GMR elements A1, A2 will be shown to ultimately have the same bias direction, opposite from the bias direction of GMR element B1 and B2. However, as opposed to the dual stack 400 of FIG. 4, both of the GMR elements A1, A2 of the dual stack of layers 800 will be shown to have the same bias direction.

As described above, nomenclature, for example 1: A1, 3: B1 is a way to indicate that the GMR element A1 is a first GMR element and GMR element B1 is a third GMR element for reasons that should be apparent in conjunction with FIG. 10. Unlike he arrangement of FIG. 4, here GMR element A1 and A2 are in the same dual stack of layers 800 and will be shown to have the same bias directions, while GMR elements A1 and B2 are in the same dual stack of layers 400 of FIG. 4 and have been shown to have opposite bias directions.

Within the dual stack 800 of GMR elements A1, A2, the single pinned GMR element A1 (or B1) can include a reference pinning layer 804 disposed over a seed layer 802, which can be disposed over a substrate 801, for example, a semiconductor substrate. A reference pinned layer structure 806 can be disposed over the reference pinning layer 804. The reference pinned layer structure 806 can be formed as a synthetic antiferromagnet (SAF) having three layers as shown. Taken together, the reference pinning layer 804 and the reference pinned layer structure 806 can be referred to as a reference layer structure.

A conductive spacer layer 808 can be disposed over the pinned layer structure 806. A free layer structure 810 can be disposed over the spacer layer 808. In some embodiments, the free layer structure 810 can have two layers comprised of different materials.

The single pinned GMR element A1 (or B1) is responsive to magnetic fields in a direction of an arrow 814 parallel to directions of the reference layer structure 804, 806.

In the absence of a magnetic field, the free layer structure 810 can take on a bias magnetic direction, here shown to be out of the page. However, the bias magnetic field and direction can be determined according to the magnetic field generated by the magnet 714 of FIG. 7 or by other local magnetic fields described in other figures below, for example, in conjunction with FIG. 9.

The dual stack 800 of GMR elements A1, A2 can include an insulator layer 812 disposed over the single pined GMR element and a another single pinned GMR element A2 disposed over the insulator layer 812. The GMR element A2 can be nearly identical the GMR element A1, except that the GMR element A2 can include a cap layer for protection.

Figure 9:
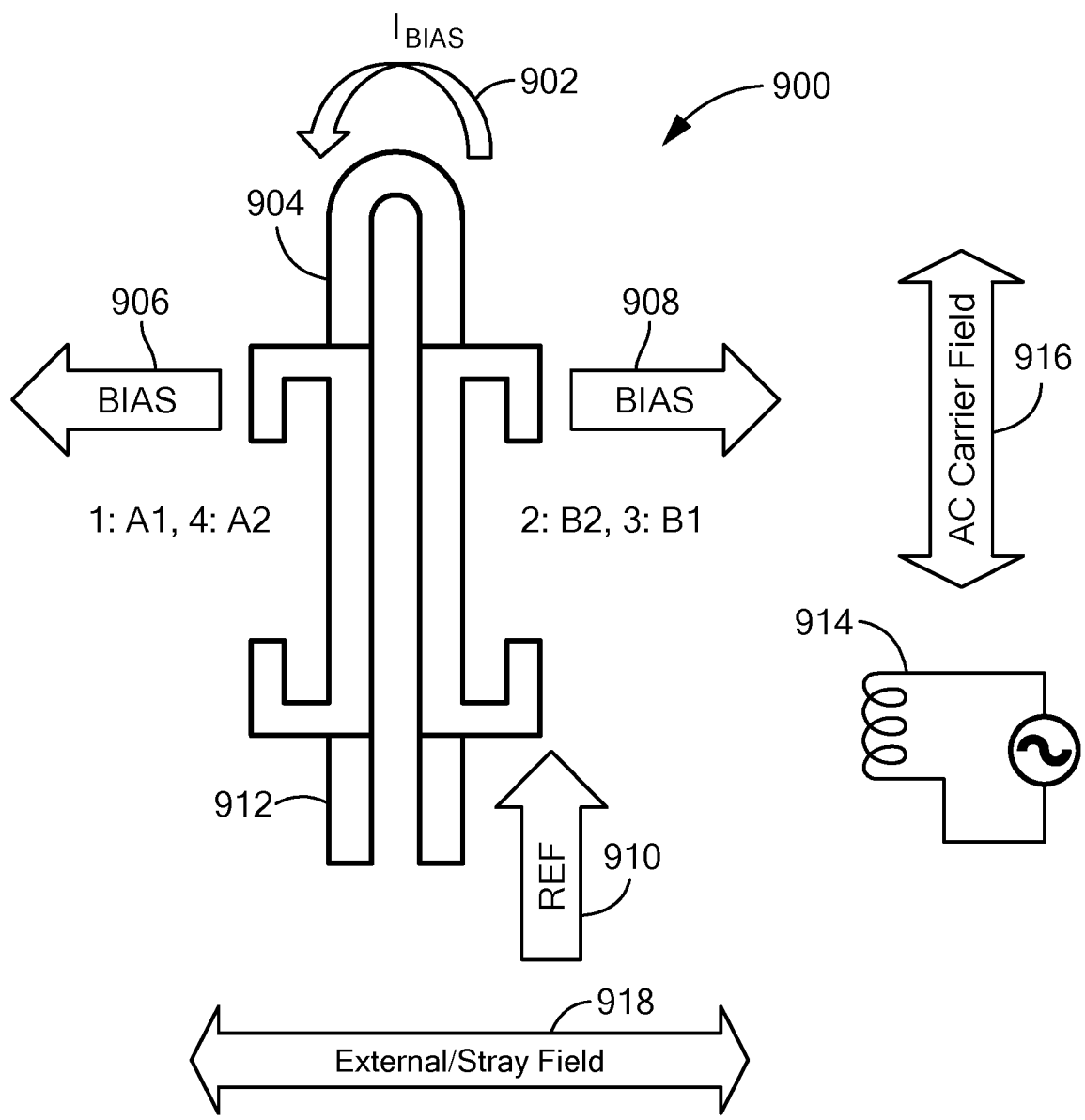
FIG. 9 is a block diagram showing of four single pinned GMR magnetoresistance elements in two stacks of layers, each stack like the stack of FIG. 8, with a common reference direction, wherein opposite bias directions are generated by a current loop.

Referring to FIG. 9, portion 900 of a magnetic field sensor can include a conductive loop 904 disposed under or over first, second, third and fourth single pinned GMR elements, respectively, shown in FIG. 8. The conductive loop can have first and second substantially parallel sides. The first and fourth GMR elements A1, A2, respectively, in a dual stack 800 of FIG. 8, are disposed on or under the first side of the conductive loop 904 and the second and third GMR elements B2, B1, respectively, in another dual stack 800 of FIG. 8 are disposed on or under the second side of the current loop 904. A DC current 902 carried in the current loop 904 can result in a DC biasing magnetic field 906 proximate to the first and fourth GMR elements A1, A2 and a DC biasing magnetic field 908 proximate to the second and third GMR elements B2, B1. The biasing magnetic fields 906, 908 are in opposite directions. The opposite direction bias magnetic fields 904, 906 are like the opposite bias magnetic fields of FIG. 7, the former generated by the current 902 passing through the conductive loop 904 and the latter generated by the magnet 714.

Unlike figures above that use magnetoresistance elements with internal bias layers that determine bias directions to bias the free layers in opposite directions, here opposite bias directions 906, 908 are determined by opposite direction magnetic fields generated by the conductive loop 904. Furthermore, unlike some magnetoresistance elements for which the reference direction is perpendicular to a longest dimension of the yoke, here, the reference direction is parallel to the longest directions of the yokes.

The current loop 904 may be positioned so that the first and fourth magnetoresistance elements A1, A2 are adjacent to one side of the conductive loop 904 and the second and third magnetoresistance elements B2, B1 adjacent to an opposite side of the conductive loop 904. The conductive loop 904 is shown as an elongated open loop, however the conductive loop 904 may be a circular loop, an oval loop, or any other type of loop that allows placement of GMR elements A1, A2 and B2, B1 on opposite sides of the current loop 904 to experience opposite direction magnetic fields.

The GMR elements A1, A2, B1, B2 can have internal reference magnetic field directions represented by an arrow 910, as generated by the reference layer structure 804, 806 of the single pinned GMR element 800 of FIG. 8. The arrows 906, 908 are indicative of bias magnetic field generated by the current loop 904 and not generated within the GMR elements A1, A4, B2, B1

A coil 914 can generate the above-described AC carrier magnetic field 916 in a direction parallel to the reference direction 910, such that the AC carrier magnetic field 916 is directly sensed by all of the GMR elements A1, A2, B2, B1. The AC carrier magnetic field 916 may be a periodic magnetic field such as an AC field, a sawtooth, or any other periodic wave shape.

The four single pinned GMR elements A1, A2, B2, B1 can be coupled in a bridge and can replace the bridge 310 of FIG. 3 for form a magnetic field sensor.

An external or stray magnetic field 918 can have a direction parallel to the bias magnetic fields 906, 908, or have a direction component parallel to the bias magnetic fields 906, 908. In operation, the external or stray magnetic field 918 can change or modulate sensitivities of the GMR elements A1, A2, B1, B2 resulting in an amplitude change or modulation of an AC signal generated by the GMR elements A1, A2, B1, B2 in response to the AC carrier field 902, which would otherwise be an AC signal without amplitude modulation.

In some alternate embodiments, the current conductor 904 can be disposed between GMR elements of the dual stacks of GMR elements. For example, the current conductor 904 can be disposed upon the insulator layer 812 of FIG. 8.

Figure 10:
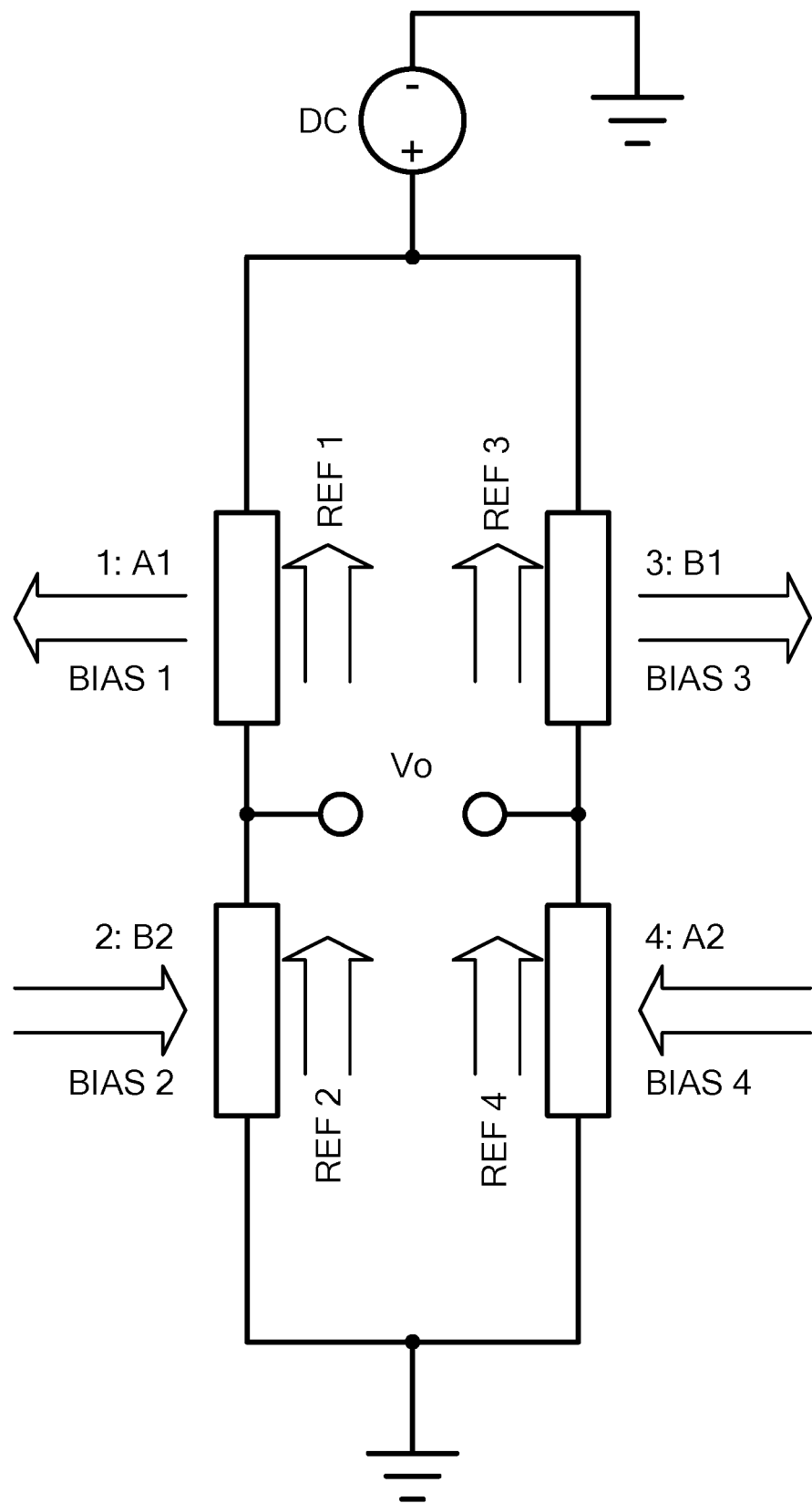
FIG. 10 is a block diagram showing four magnetoresistance elements arranged in a bridge.
Figure 11:
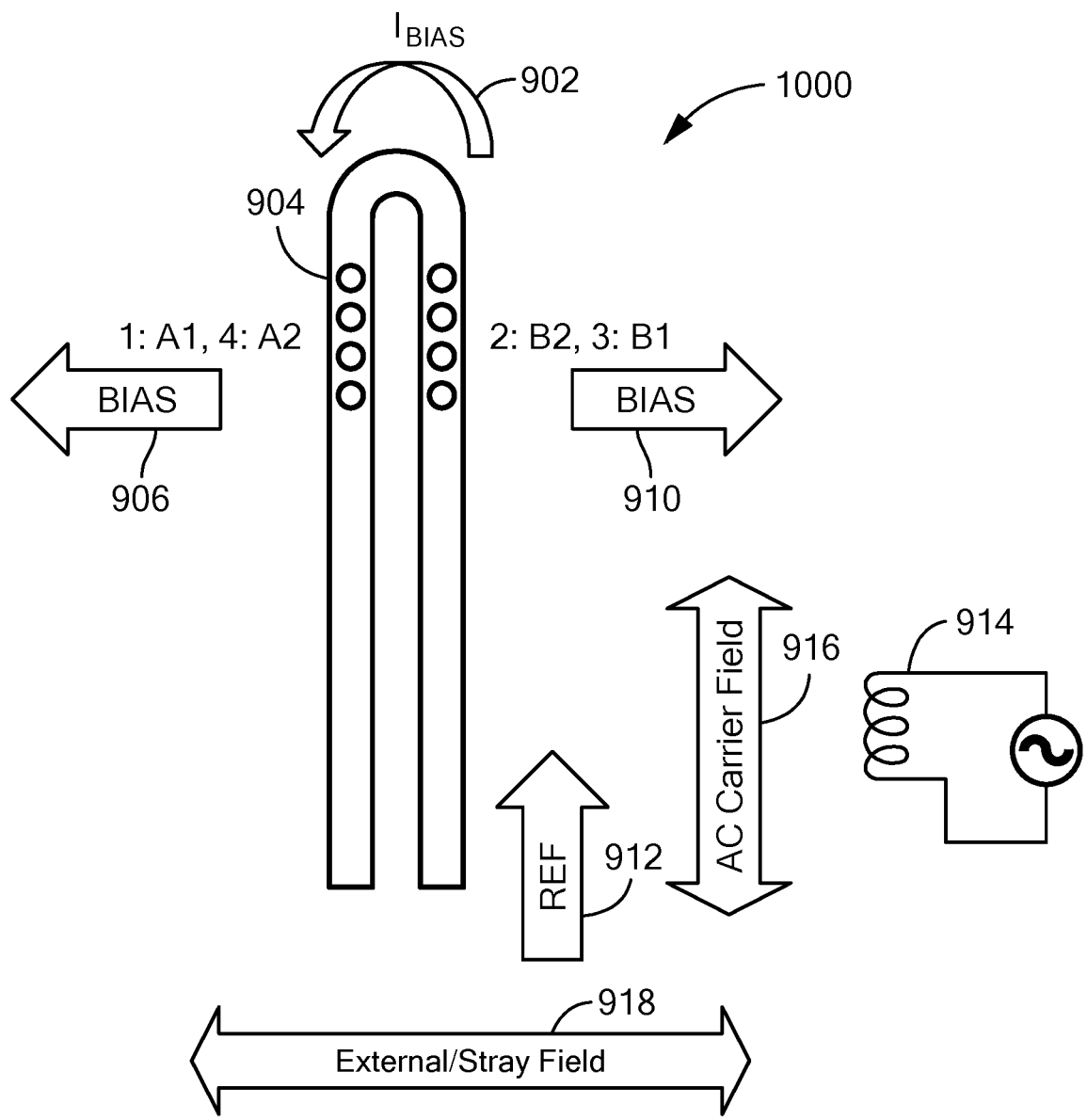
FIG. 11 is a block showing pillars of four single pinned TMR magnetoresistance elements in two stacks of layers with a common reference direction, wherein opposite bias directions are generated by a current loop.

Referring now to FIG. 10, in which like elements of FIGS. 9 and 11 are shown having like reference designations, the four magnetoresistance elements A1, A2, B1, B2 can be coupled as shown The first and second magnetoresistance elements A1, B2 can be coupled in a first series arrangement at a first junction node, and the third and fourth magnetoresistance elements B1, A2 can be coupled in a second series arrangement at a second junction node. A differential signal is generated between the first and second junction nodes. The first, second, third, and fourth magnetoresistance elements A1, B2, B1, A2, respectively, comprise respective first, second, third and fourth reference layer structures having a respective first, second, third, and fourth reference directions, each in the same direction. The first and fourth magnetoresistance elements A1, A2, respectively, experience respective first and fourth bias magnetic fields, each having a first direction orthogonal to the reference direction. The second and third magnetoresistance elements B2, B1 experience respective second and third bias magnetic fields each having a second direction opposite to the first direction, resulting in the first and fourth magnetoresistance elements having a first direction of maximum sensitivity and the second and third magnetoresistance elements having a second direction of maximum sensitivity opposite to the first direction of maximum sensitivity.

Referring now to FIG. 11, in which like elements of FIG. 9 are shown having like reference designations, another portion 1000 of a magnetic field sensor can be like the magnetic arrangement of FIG. 9, except the four GMR elements A1, A2, B1, B2 of FIG. 9 are replaced by four TMR elements A1, A2, B1, B2.

Each TMR element A1, A2, B1, B2 can be comprised of a plurality of so-called "pillars," each having a cylindrical shape. Four pillars are shown for each one of the TMR elements A1, A2, B1, B2. However, in other embodiments each one of the TMR elements A1, A2, B1, B2 can include a different number of pillars, fewer than or greater than four pillars. In some embodiments, each TMR element A1, A2, B1, B2 has approximately thirty pillars. The pillars of each one of the TMR elements A1, A2, B1, B2 can be coupled together in series, resulting in four effective TMR elements A1, A2, B1, B2. Groups of TMR elements can be coupled to reduce a voltage across any one of the TMR pillars, in order to allow internal structures of the TMR pillar to survive without breakdown.

TMR elements are not described in detail herein. However, let it suffice here to say that each one of the TMR pillars can have layers similar to the layers of FIG. 4 for double pinned arrangements or similar to the layers of FIG. 8 for single pinned TMR elements. However, among other differences, in the TMR elements, the Cu conductive layer of a GMR element can be replace by a tunneling barrier layers comprised of, for example, MgO. Drive currents tend to flow horizontally in GMR elements with respect to a substrate upon which they are formed, and drive currents tend to flow vertically through TMR elements and though the tunneling barrier layer. GMR and TMR elements are typically responsive to magnetic fields parallel to, or have direction components parallel to, a major surface of the substrate.

Any of the above describe portions of magnetic field sensors, GMR or TMR elements, of bridge circuits can be used in the magnetic field sensor of FIG. 3. It should be apparent how to modify the magnetic field sensor 300 to accommodate any of the above described portions, GMR or TMR elements, or bridge circuits.

Figure 12:
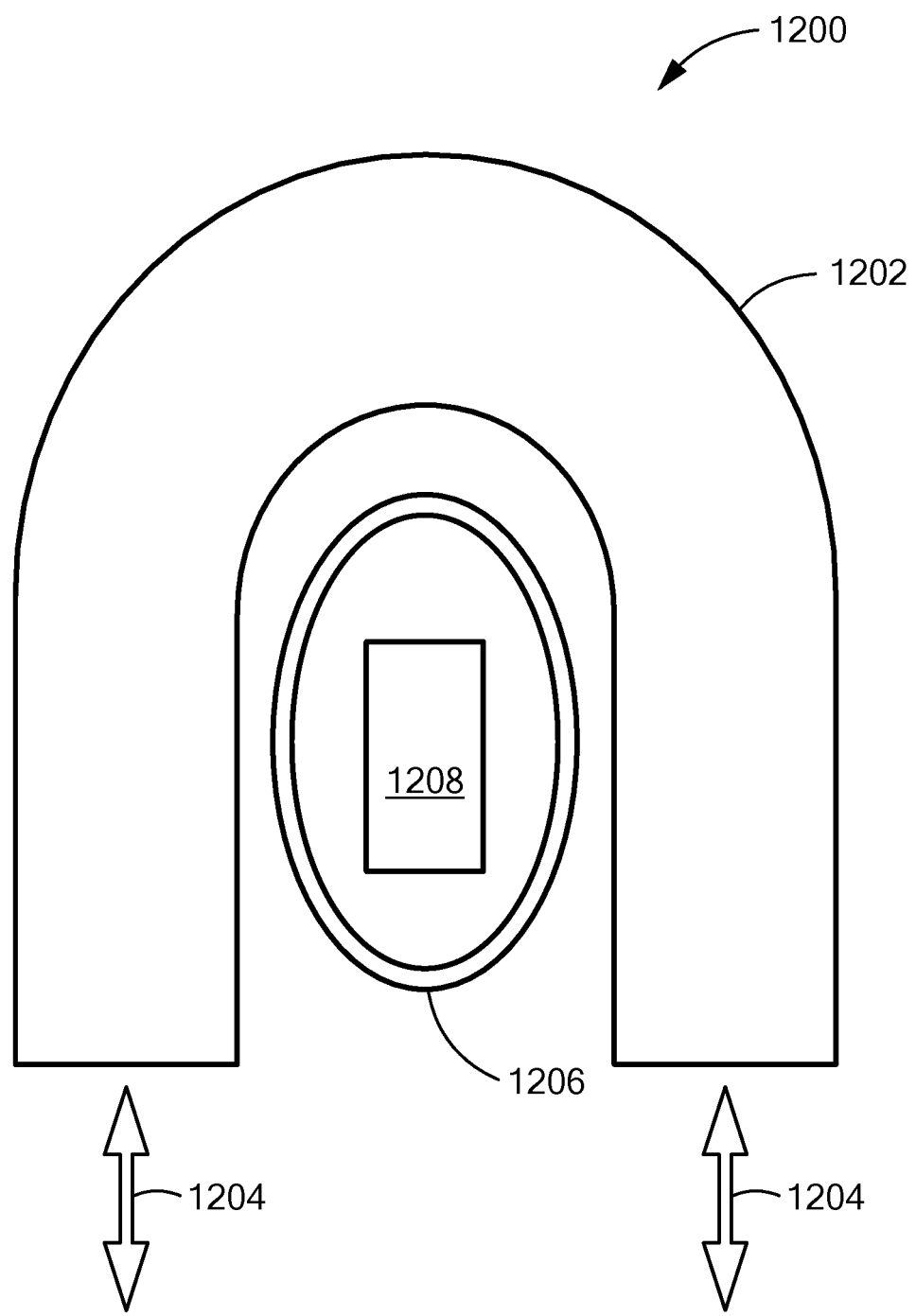
FIG. 12 is a block diagram showing an illustrative magnetic field sensor with a region in which any of the above arrangements can be placed in order to insensitive to a current carried in a current conductor, AC or DC.

Referring now to FIG. 12, a magnetic field sensing arrangement 1200 can be insensitive to a magnetic field generated by a current 1204 flowing through a conductor 1202. The current 1204 is here shown to be an alternating current (AC), however the magnetic field sensing arrangement 1200 can also be insensitive to a DC current. In response to the current 902, the conductor generates an external or stray magnetic field into and/or out of the page within a circle 1206. A magnetic field sensor 1208 like any of the magnetic field sensors described above can sense only magnetic fields or magnetic field projections parallel to the page, i.e., parallel to a largest surface of a substrate that holds the magnetic field sensor.

The circle 1206 is indicative of illustrative positions of the magnetic field sensor of FIG. 3 in order to be insensitive to the magnetic field resulting from the current 1202. Here, a substrate is on face and is representative of a position of the substrate 301 of FIG. 3.

The conductor 1202 should not be confused with the current conductor 904 of FIGS. 9 and 11, which can be upon or proximate to the substrate and can be operable to generate the above-described bias magnetic fields separate and apart from the magnetic field generated by the conductor 1202, which current is merely proximate to the magnetic field sensor 300.

Various embodiments are described in this patent. However, the scope of the patent should not be limited to the described embodiments, but rather should be limited only by the spirit and scope of the following claims. All references cited in this patent are incorporated by reference in their entirety.

The invention claimed is:

1. A magnetic field sensor comprising:
   first, second, third, and fourth magnetoresistance elements coupled to form a bridge circuit, wherein the first and second magnetoresistance elements are coupled in a first series arrangement at a first junction node and the third and fourth magnetoresistance elements are coupled in a second series arrangement at a second junction node, wherein a differential signal is generated between the first and second junction nodes, wherein the first, second, third, and fourth magnetoresistance elements comprise respective first, second, third and fourth reference layer structures having a respective first, second, third, and fourth reference directions, each in the same direction, wherein the first and fourth magnetoresistance elements experience respective first and fourth bias magnetic fields, each having a first direction orthogonal to the reference direction, wherein the second and third magnetoresistance elements experience respective second and third bias magnetic fields each having a second direction opposite to the first direction, resulting in the first and fourth magnetoresistance elements having a first direction of maximum sensitivity and the second and third magnetoresistance elements having a second direction of maximum sensitivity opposite to the first direction of maximum sensitivity, wherein each one of the first, second, third, and fourth magnetoresistance elements is arranged to experience substantially the same magnitude and direction of an external magnetic field, and wherein the bridge circuit is positioned so that, in the presence of the external magnetic field, respective sensitivities of the first, second, third, and fourth magnetoresistance elements change in response to the external magnetic field.

2. The magnetic field sensor of claim 1, further comprising
an electronic circuit, comprising:
  a carrier signal generator operable to generate an AC carrier magnetic field in a direction substantially the same as the first, second, third, and fourth reference directions, wherein the first, second, third, and fourth magnetoresistance elements experience the AC carrier magnetic field to generate an AC signal, wherein an amplitude of the AC signal changes in response to the external magnetic field.

3. The magnetic field sensor of claim 2, wherein the electronic circuit further comprises:
  an amplitude detector circuit to receive the AC signal and operable to detect an amplitude change of the AC signal.

4. The magnetic field sensor of claim 3, further comprising:
  a substrate, wherein the first, second, third and fourth magnetoresistance elements and the electronic circuit are disposed upon a major surface of the substrate.

5. The magnetic field sensor of claim 4, wherein the first, second, third and fourth magnetoresistance elements are double pinned magnetoresistance elements, wherein the first, second, third and fourth magnetoresistance elements have respective first, second, third, and fourth bias layer structures operable to generate the first, second, third, and fourth bias magnetic fields, respectively.

6. The magnetic field sensor of claim 5, wherein the first and fourth magnetoresistance elements comprise first and fourth spacer layers, respectively, each selected to result in an antiferromagnetic coupling, and wherein the second and third magnetoresistance elements comprise a second and third spacer layers, respectively, each selected to result in a ferromagnetic coupling.

7. The magnetic field sensor of claim 6, wherein the magnetic field sensor further comprises a first insulating layer disposed between the first and second magnetoresistance elements in a first dual element stack arrangement, and wherein the magnetic field sensor further comprises a second insulating layer disposed between the third and fourth magnetoresistance elements in a second dual element stack arrangement.

8. The magnetic field sensor of claim 7, wherein the first, second, third, and fourth magnetoresistance elements are GMR elements.

9. The magnetic field sensor of claim 7, wherein the first, second, third, and fourth magnetoresistance elements are TMR elements.

10. The magnetic field sensor of claim 4, wherein the first, second, third and fourth magnetoresistance elements are single pinned magnetoresistance elements, wherein bias directions of the first, second, third, and fourth magnetoresistance elements are determined by first, second, third, and fourth bias magnetic fields that originate outside of the first, second, third and fourth magnetoresistance elements.

11. The magnetic field sensor of claim 10, further comprising:
  a magnet disposed proximate to the substrate, wherein the first, second, third, and fourth bias magnetic fields are generated by the magnet.

12. The magnetic field sensor of claim 11, wherein the first, second, third, and fourth magnetoresistance elements are GMR elements.

13. The magnetic field sensor of claim 11, wherein the first, second, third, and fourth magnetoresistance elements are TMR elements.

14. The magnetic field sensor of claim 10, further comprising:
  a current conductor, wherein the first, second, third, and fourth bias magnetic fields are generated by a current flowing through the current conductor.

15. The magnetic field sensor of claim 14, wherein the current conductor is disposed upon the substrate, wherein the current conductor is formed as a loop having first and second sides.

16. The magnetic field sensor of claim 14, wherein the first and second magnetoresistance elements are disposed proximate to the first side and the third and fourth magnetoresistance elements are disposed proximate to the second side.

17. The magnetic field sensor of claim 16, wherein the first, second, third, and fourth magnetoresistance elements are GMR elements.

18. The magnetic field sensor of claim 16, wherein the first, second, third, and fourth magnetoresistance elements are TMR elements.

19. The magnetic field sensor of claim 1, wherein the magnetic field sensor further comprises a first insulating layer disposed between the first and second magnetoresistance elements in a first dual element stack arrangement, and wherein the magnetic field sensor further comprises a second insulating layer disposed between the third and fourth magnetoresistance elements in a second dual element stack arrangement.

* * * * *

UNITED STATES PATENT AND TRADEMARK OFFICE
CERTIFICATE OF CORRECTION

PATENT NO. : 10,866,287 B1
APPLICATION NO. : 16/507552
DATED : December 15, 2020
INVENTOR(S) : Rémy Lassalle-Balier et al.

It is certified that error appears in the above-identified patent and that said Letters Patent is hereby corrected as shown below:

In the Specification

Column 1, Line 23 delete "with bias" and replace with --with a bias--.

Column 1, Line 49 delete "signal pinned" and replace with --single pinned--.

Column 1, Line 54 delete "Magnetoresistance can" and replace with --Magnetoresistance elements can--.

Column 1, Line 56 delete "element" and replace with --elements--.

Column 3, Line 30 delete "showing of four" and replace with --showing four--.

Column 3, Line 37 delete "block showing" and replace with --block diagram showing--.

Column 3, Line 44 delete "in order to insensitive to" and replace with --in order to be insensitive to--.

Column 3, Lines 59-60 delete "element (AMR)" and replace with --(AMR) element--.

Column 4, Line 40 delete "be replace" and replace with --be replaced--.

Column 4, Line 67 delete "magnetic 108" and replace with --magnetic field 108--.

Column 5, Line 4 delete "below" and replace with --below.--.

Column 5, Line 16 delete "FIG. 2 bias" and replace with --FIG. 2, bias--.

Column 5, Line 49 delete "sensor 30" and replace with --sensor 300--.

Column 5, Line 60 delete "signals" and replace with --signal--.

Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,866,287 B1

Column 6, Line 4 delete "wave, a" and replace with --wave, or a--.

Column 7, Line 30 delete "416, 406" and replace with --414, 406--.

Column 8, Line 1 delete "element" and replace with --elements--.

Column 8, Line 18 delete "301, 310b" and replace with --310a, 310b--.

Column 8, Line 63 delete "placed a shown" and replace with --placed as shown--.

Column 9, Line 9 delete "magnetic 714" and replace with --magnet 714--.

Column 9, Line 26 delete "element" and replace with --elements--.

Column 9, Line 30 delete "substrate 80" and replace with --substrate 801--.

Column 9, Line 32 delete "element" and replace with --elements--.

Column 9, Line 40 delete "he" and replace with --the--.

Column 9, Line 40 delete "element" and replace with --elements--.

Column 10, Line 7 delete "and a another" and replace with --and another--.

Column 10, Line 9 delete "identical the" and replace with --identical to the--.

Column 10, Line 44 delete "B1 adjacent" and replace with --B1 are adjacent--.

Column 10, Line 57 delete "A4" and replace with --A2--.

Column 10, Line 67 delete "for form" and replace with --to form--.

Column 11, Line 18 delete "shown" and replace with --shown.--.

Column 11, Line 67 delete "be replace" and replace with --be replaced--.

Column 12, Line 8 delete "above describe" and replace with --above described--.

Column 12, Line 9 delete "of" and replace with --or--.